United States Patent
Shah et al.

(10) Patent No.: US 9,070,552 B1
(45) Date of Patent: Jun. 30, 2015

(54) ADAPTIVE STANDARD CELL ARCHITECTURE AND LAYOUT TECHNIQUES FOR LOW AREA DIGITAL SOC

(71) Applicant: QUALCOMM Incorporated, San Diego, CA (US)

(72) Inventors: Jay Madhukar Shah, Bangalore (IN); Kamesh Medisetti, Bangalore (IN); Vijayalakshmi Ranganna, Bangalore (IN); Animesh Datta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/267,888

(22) Filed: May 1, 2014

(51) Int. Cl.
*H01L 23/52* (2006.01)
*H01L 27/02* (2006.01)
*H01L 23/528* (2006.01)

(52) U.S. Cl.
CPC ......... *H01L 27/0207* (2013.01); *H01L 23/5286* (2013.01)

(58) Field of Classification Search
CPC ............ H01L 27/0207; H01L 27/11807; H01L 23/5221; H01L 23/5286; G06F 17/5077
USPC .......................................................... 257/207
See application file for complete search history.

(56) References Cited

U.S. PATENT DOCUMENTS

| | | |
|---|---|---|
| 6,725,443 B1 | 4/2004 | Pang et al. |
| 7,989,849 B2 | 8/2011 | Sherlekar et al. |
| 8,513,978 B2 | 8/2013 | Sherlekar |
| 8,742,464 B2 * | 6/2014 | Sherlekar et al. ............. 257/207 |
| 2013/0074029 A1 | 3/2013 | Blatchford |
| 2013/0154128 A1 | 6/2013 | Wang et al. |

* cited by examiner

*Primary Examiner* — Tu-Tu Ho
(74) *Attorney, Agent, or Firm* — Arent Fox LLP

(57) ABSTRACT

A standard cell CMOS device includes a first power rail extending across the standard cell. The first power rail is connected to one of a first voltage or a second voltage less than the first voltage. The device further includes a second power rail extending across the standard cell. The second power rail is connected to an other one of the first voltage or the second voltage. The second power rail includes a metal x layer interconnect and a set of metal x−1 layer interconnects connected to the metal x layer interconnect. The device further includes a set of CMOS transistor devices between the first and second power rails and powered by the first and second power rails. The device further includes an x−1 layer interconnect extending under and orthogonal to the second power rail. The x−1 layer interconnect is coupled to the set of CMOS transistor devices.

27 Claims, 5 Drawing Sheets

ADAPTIVE STANDARD CELL ARCHITECTURE AND LAYOUT TECHNIQUES FOR LOW AREA DIGITAL SOC

BACKGROUND

1. Field

The present disclosure relates generally to a layout construction, and more particularly, to an adaptive standard cell architecture and layout techniques for low area digital system-on-chip (SoC).

2. Background

A standard cell is an integrated circuit that may be implemented with digital logic. An application-specific integrated circuit (ASIC), such as an SoC device, may contain thousands to millions of standard cells. Such standard cells may occupy around 20% of an SoC. Reducing a size/area footprint of ASICs is beneficial. Accordingly, there is a need for reducing the size/area footprint of individual standard cells.

SUMMARY

In an aspect of the disclosure, a standard cell complementary metal oxide semiconductor (CMOS) device includes a first power rail extending across the standard cell. The first power rail is connected to one of a first voltage or a second voltage less than the first voltage. The standard cell CMOS device further includes a second power rail extending across the standard cell. The second power rail is connected to an other one of the first voltage or the second voltage. The second power rail includes a metal x layer interconnect and a set of metal x−1 layer interconnects connected to the metal x layer interconnect. The standard cell CMOS device further includes a set of CMOS transistor devices between the first power rail and the second power rail and powered by the first power rail and the second power rail. The standard cell CMOS device further includes an x−1 layer interconnect extending under the second power rail and orthogonal to the second power rail. The x−1 layer interconnect is coupled to the set of CMOS transistor devices.

The x−1 layer interconnect may extend between two x−1 layer interconnects of the set of metal x−1 layer interconnects that are part of the second power rail. In one configuration, x is equal to two and the second power rail includes a metal two layer interconnect and a set of metal one layer interconnects.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
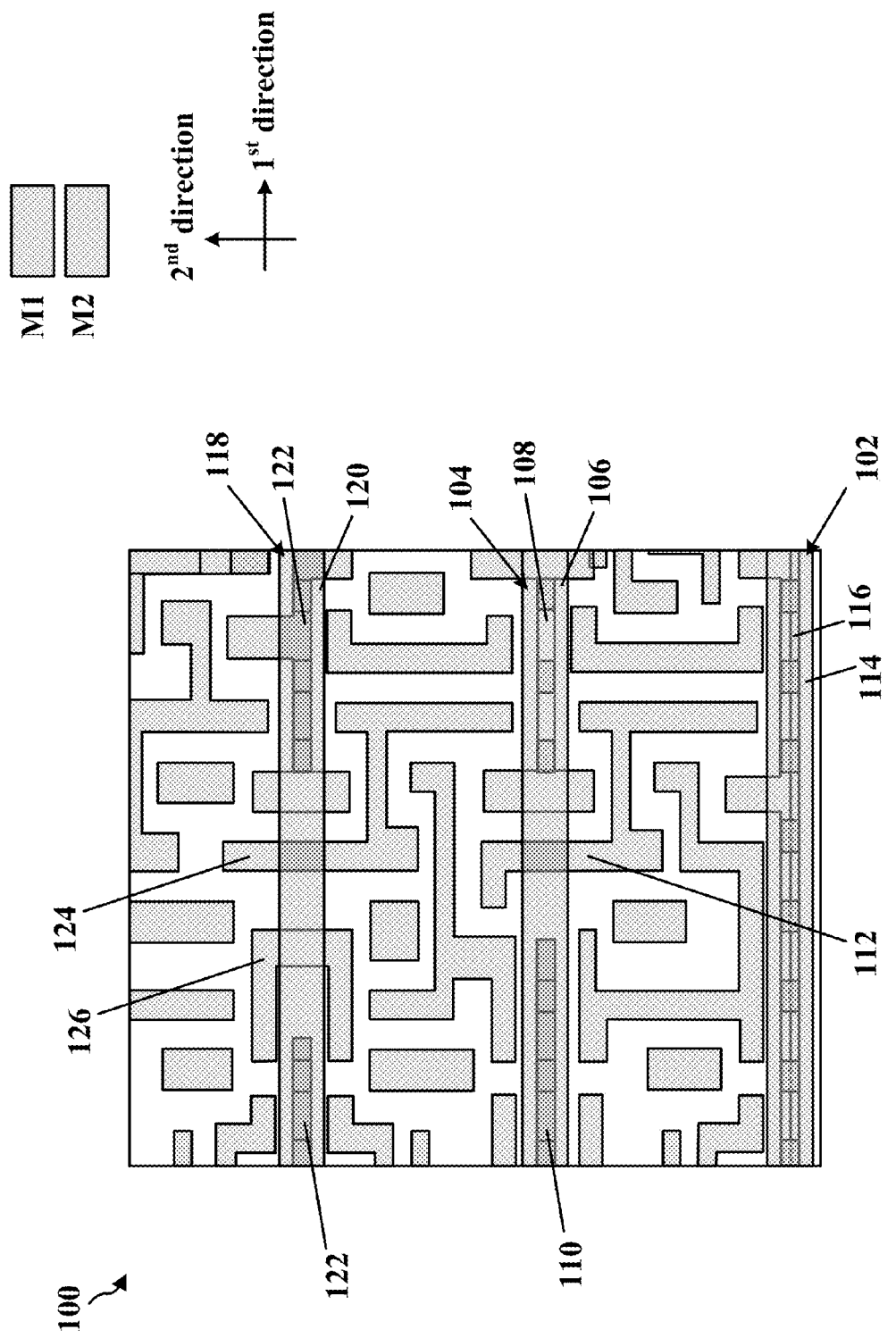
FIG. 1 is a diagram illustrating a portion of an exemplary CMOS device.

FIG. 1 is a diagram 100 illustrating a portion of an exemplary CMOS device. The CMOS device includes a first power rail/bus 102 extending across the standard cell (only a portion of the standard cell is illustrated in the diagram 100). The first power rail 102 is connected to one of a first voltage or a second voltage less than the first voltage. For example, the first voltage may be $V_{dd}$ and the second voltage may be $V_{ss}$ (which may be ground (GND)). The CMOS device further includes a second power rail/bus 104 extending across the standard cell. The second power rail 104 is connected to an other one of the first voltage or the second voltage. For example, the first power rail 102 may be connected to $V_{ss}$ and the second power rail may be connected to $V_{dd}$. Alternatively, the first power rail 102 may be connected to $V_{dd}$ and the second power rail may be connected to $V_{ss}$. The second power rail 104 includes a metal x layer interconnect 106 and a set of metal x−1 layer interconnects 108, 110 connected to the metal x layer interconnect. For example, the metal x layer interconnect 106 may be a metal two (M2) layer interconnect and the set of metal x−1 layer interconnects 108, 110 may be a set of metal one (M1) layer interconnects. The CMOS device further includes a set of CMOS transistor devices between the first and second power rails 102, 104 and powered by the first and second power rails 102, 104. The CMOS device further includes an x−1 layer interconnect 112 extending under the second power rail 104 and orthogonal to the second power rail 104. The x−1 layer interconnect 112 is coupled to the set of CMOS transistor devices, which are between the first and second power rails 102, 104. The second power rail 104 extends in a first direction (e.g., horizontal direction), and the x−1 layer interconnect 112 extends in a second direction (e.g., vertical direction) orthogonal to the first direction.

As shown in FIG. 1, the first power rail 102 includes an M2 layer interconnect 114 shunted with an M1 layer interconnect 116. The second power rail 104 includes an M2 layer interconnect 106 shunted with a plurality of M1 layer interconnects 108, 110. The M1 layer interconnects 108, 110 of the second power rail 104 are separated to allow the M1 layer interconnect 112 to extend under the second power rail 104 without contacting the M1 layer interconnects 108, 110. The set of CMOS devices between the first and second power rails 102, 104 may be connected to a second set CMOS devices between the second power rail 104 and a third power rail/bus 118 through the M1 layer interconnect 112. Accordingly, fewer higher metal layer interconnects (e.g., metal three (M3) layer interconnects) that extend in the second direction (e.g., vertical direction) may be used to interconnect the set of CMOS devices between the first and second power rails 102, 104 with the second set of CMOS devices between the second and third power rails 104, 118. When fewer higher metal layer interconnects are used for inter-cell connections (local routing), more tracks are available for intra-cell connections. Having more tracks available for intra-cell connections makes intra-cell routing easier and may decrease a cost of manufacturing the SoC if less masks/fewer layers are needed to manufacture the SoC.

As shown in FIG. 1, the x−1 layer interconnect 112 extends between two x−1 layer interconnects 108 and 110 of the set of metal x−1 layer interconnects 108, 110 that are part of the second power rail 104. When x is equal to two, the second power rail 104 includes an M2 layer interconnect 106 and a set of M1 layer interconnects 108, 110. The first power rail 102 may include only the M1 layer interconnect 116, only the M2 layer interconnect 114, or both the M1 and M2 layer interconnects 114, 116. The first and second power rails 102, 104 may extend parallel to each other. The set of metal x−1 layer interconnects 108, 110 may extend under the metal x layer interconnect 106 and parallel to the metal x layer interconnect 106. The CMOS device may further include the third power rail 118 extending across the standard cell. The third power rail 118 is connected to one of the first voltage or the second voltage. For example, the first and third power rails 102, 118 may be connected to $V_{ss}$ and the second power rail 104 may be connected to $V_{dd}$. Alternatively, the first and third power rails 102, 118 may be connected to $V_{dd}$ and the second power rail 104 may be connected to $V_{ss}$. The third power rail 118 may include a metal x layer interconnect 120 and/or a metal x−1 layer interconnect 122. The third power rail 118 may include multiple separate metal x−1 layer interconnects 122 if the third power rail 118 is within a standard cell (as shown) and not on an edge of a standard cell. As illustrated, the third power rail 118 includes the metal x layer interconnect 120 and multiple separate metal x−1 layer interconnects 122. The CMOS device may further include a second set of CMOS transistor devices between the second and third power rails 104, 118 that are powered by the second and third power rails 104, 118. The x−1 layer interconnect 112 may also be coupled to the second set of CMOS transistor devices between the second and third power rails 118. If the third power rail 118 includes metal x−1 layer interconnects that are separated (e.g., the M1 layer interconnects 122), the CMOS device may include additional metal x−1 layer interconnects 124, 126 that extend under the third power rail 118 in the second direction, orthogonal to the first direction and to the third power rail 118. The metal x−1 layer interconnects 124, 126 may be coupled to the second set of CMOS transistor devices between the second and third power rails 104, 118, and to a third set of CMOS transistors devices between the third power rail 118 and a fourth power rail.

Figure 2:
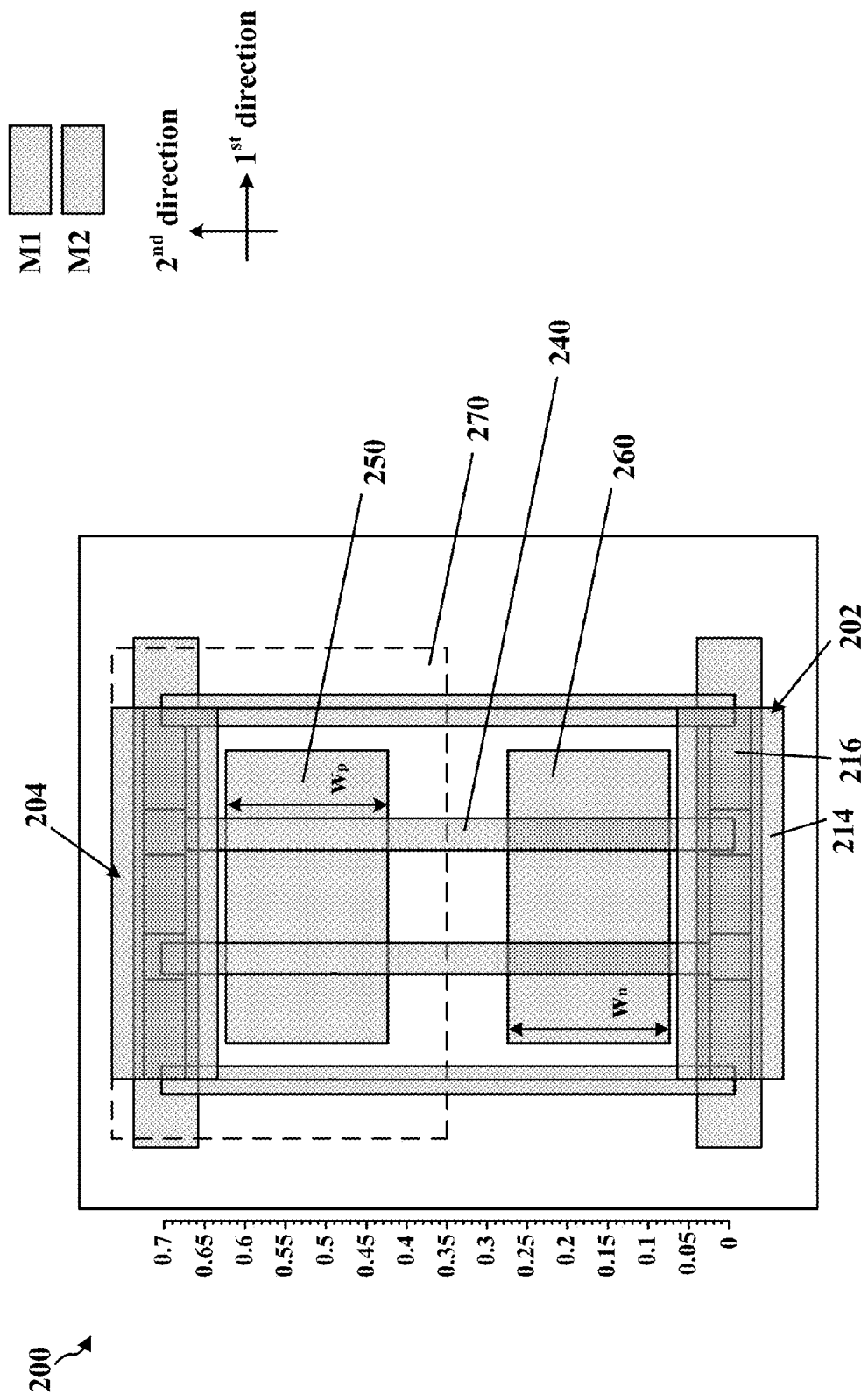
FIG. 2 is diagram illustrating an exemplary 7-track cell architecture.

FIG. 2 is diagram 200 illustrating an exemplary 7-track cell architecture. Individual cells may have a cell height that allows for seven M1 layer tracks (rather than eight or more tracks) that extend in the first direction orthogonal to gate interconnects 240 that extend in the second direction. The M1 layer tracks may have a pitch of x nm (e.g., 100 nm), providing a cell height of 7 x nm (e.g., 700 nm). The 7-track standard cell architecture may apply to a 28 nm manufacturing process technology or other manufacturing process technologies (e.g., 40 nm manufacturing process technology). A standard cell may include multiple such cells. Accordingly, with a 7-track cell architecture, a standard cell may include 7*n M1 layer tracks, where n is the number of vertically aligned cells. As discussed in relation to FIG. 1, a power rail 202 may include an M2 layer interconnect 214 shunted with an M1 layer interconnect 216. When the power rail is on an edge of a standard cell, both the M1 and M2 layer interconnects 214, 216 may extend unseparated across the cell (as shown in FIG. 2). However, when the power rail is within a standard cell, the M1 layer interconnect 216 may be separated to allow for local routing with M1 layer interconnects that extend in the second direction under the M2 layer interconnect 214 and between the separated M1 layer interconnect 216 (as shown in FIG. 1 in relation to the second and third power rails 104, 118).

As shown in FIG. 2, with a reduced cell height, a width $w_p$ of the p-type active region 250 may be approximately equal to a width $w_n$ of the n-type active region 260. Further, the n-type well 270 may be centered within the cell. Accordingly, the set of CMOS transistor devices discussed supra in relation to FIG. 1 may include a set of p-type metal oxide semiconductor (pMOS) transistor devices within the p-type active region 250 and a set of n-type metal oxide semiconductor (nMOS) transistor devices within the n-type active region 260. A width $w_p$ of the pMOS transistor devices may be approximately equal to a width $w_n$ of the nMOS transistor devices, providing a pMOS/nMOS (PN) ratio of one. The pMOS transistor devices are on the n-type well 270. One edge of the n-type well is approximately in a middle of the cell between the power rail 202 and the power rail 204.

Figure 3:
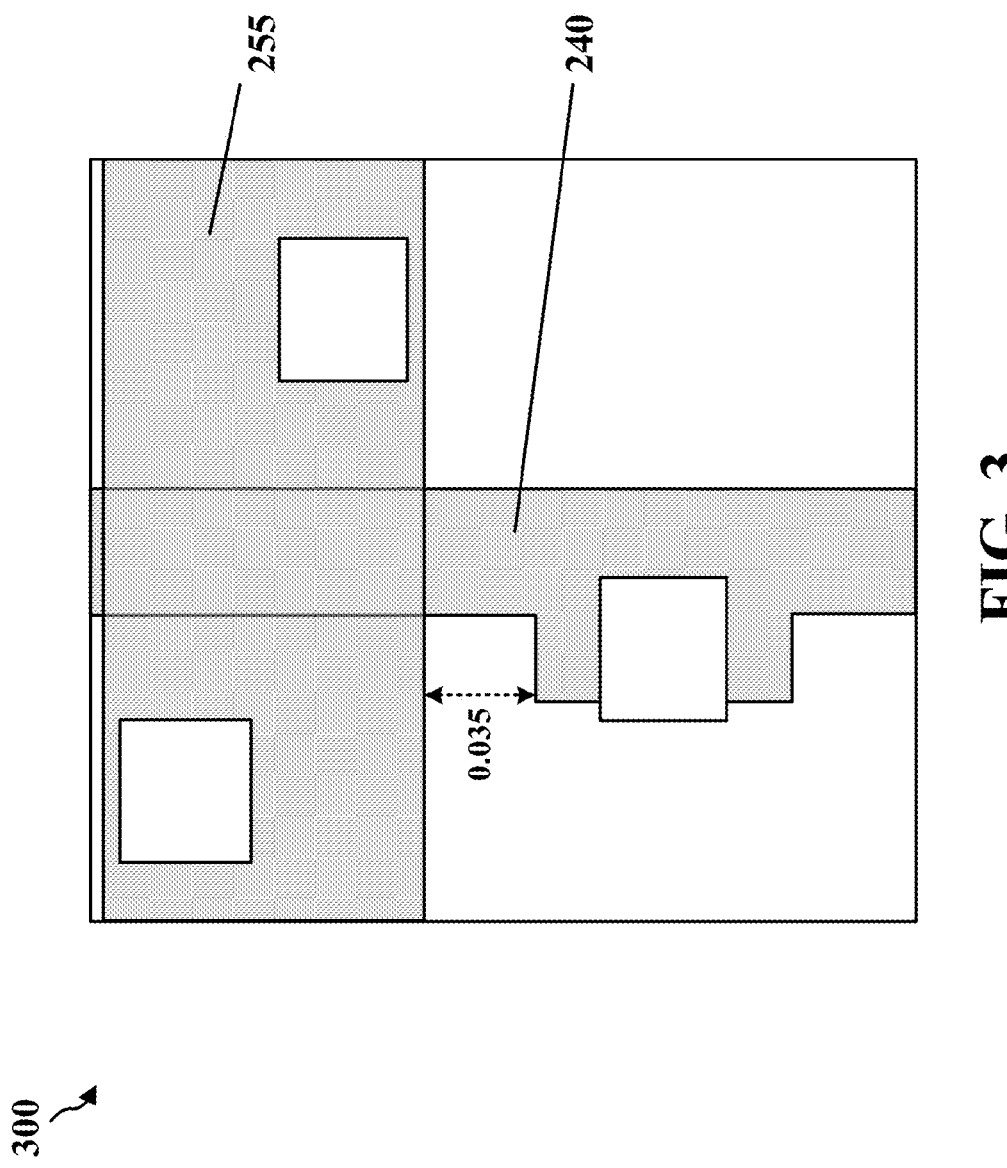
FIG. 3 is a diagram illustrating a jog spacing of a gate interconnect with respect to an active region.

FIG. 3 is a diagram 300 illustrating a jog spacing of a gate interconnect 240 with respect to an active region 255. When the width $w_n$ or the width $w_p$ is less than a width w (e.g., 200 nm), a requisite jog spacing between the gate interconnect 240 and the active region 255 may be greater than a requisite jog spacing between the gate interconnect 240 and the active region 255 when the width $w_n$ or the width $w_p$ is greater than or equal to the width w. Accordingly, the widths $w_p$ and $w_n$ may be adjusted to allow for a smaller requisite jog spacing (e.g., 35 nm rather than 70 nm) between the gate interconnect 240 and the active region 255, even though such an adjustment may result in a mismatch in the drive strength of the pMOS and nMOS transistors (pMOS and nMOS transistors are approximately matched in drive strength when the PN ratio is approximately 1.45).

Figure 4:
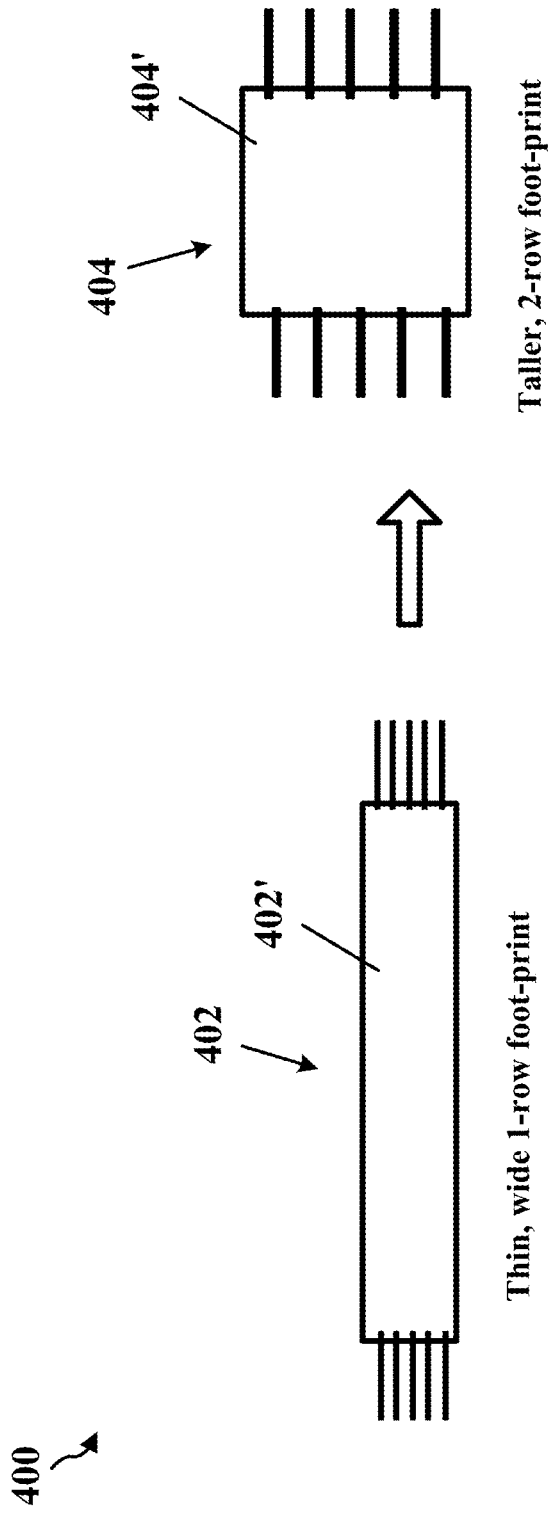
FIG. 4 is a diagram illustrating standard cell footprint comparisons.

FIG. 4 is a diagram 400 illustrating standard cell footprint comparisons. When there is no power rail separation to allow for inter-cell local routing with M1 layer interconnects and use of M3 or higher layer interconnects is avoided as much as possible, a standard cell 402 may have the footprint 402'. The standard cell 402 may include four individual cells (see FIG. 2), which are located horizontally so that inter-cell local routing may use M2 layer interconnects rather than M3 or higher layer interconnects. However, when there is power rail separation to allow for inter-cell local routing with M1 layer interconnects, a standard cell 404 may have the footprint 404' without increasing or substantially increasing use of M3 or higher layer interconnects. The standard cell 404 may include four individual cells (see FIG. 2), which are located both vertically and horizontally so that inter-cell local routing may use both M1 and M2 layer interconnects rather than M3 or higher layer interconnects. The footprint 404' provides better pin access (i.e., the pins may be spaced farther apart) and a smaller area (assuming that the footprint 402' has eight or more M1 layer tracks).

Figure 5:
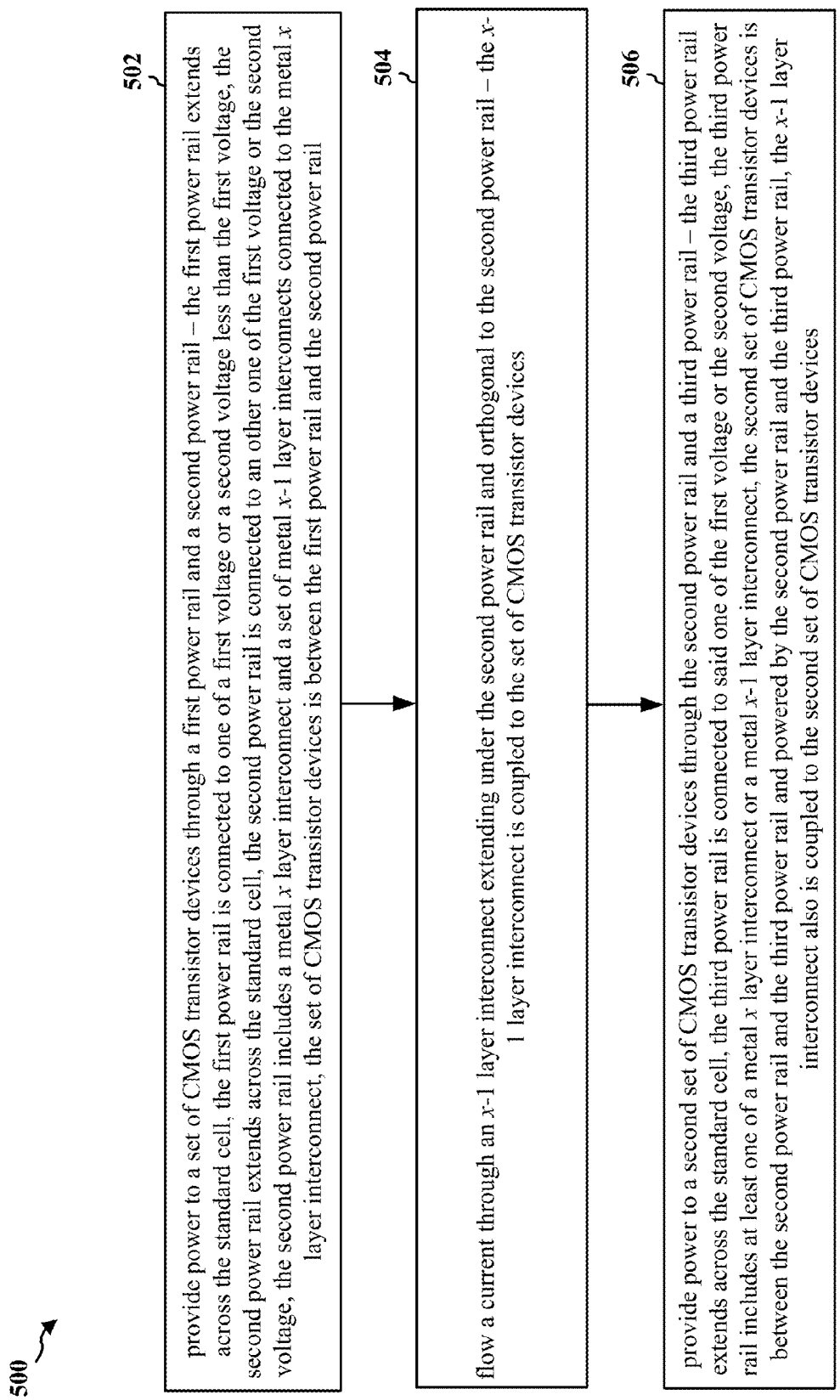
FIG. 5 is a flow chart of a method of operating a standard cell CMOS device.

FIG. 5 is a flow chart 500 of a method of operating a standard cell CMOS device. As shown in FIG. 5, in step 502, power is provided to a set of CMOS transistor devices through a first power rail and a second power rail. The first power rail extends across the standard cell. The first power rail is connected to one of a first voltage or a second voltage less than the first voltage. The second power rail extends across the standard cell. The second power rail is connected to an other one of the first voltage or the second voltage. The second power rail includes a metal x layer interconnect and a set of metal x−1 layer interconnects connected to the metal x layer interconnect. The set of CMOS transistor devices is between the first power rail and the second power rail. In step 504, a current is flowed through an x−1 layer interconnect extending under the second power rail and orthogonal to the second power rail. The x−1 layer interconnect is coupled to the set of CMOS transistor devices.

In one configuration, the x−1 layer interconnect extends between two x−1 layer interconnects of the set of metal x−1 layer interconnects that are part of the second power rail. In one configuration, x is equal to two and the second power rail includes an M2 layer interconnect and a set of M1 layer interconnects. In one configuration, the first power rail includes at least one of an M1 layer interconnect or an M2 layer interconnect. In one configuration, the first power rail and the second power rail extend parallel to each other. In one configuration, the set of metal x−1 layer interconnects extends under the metal x layer interconnect and parallel to the metal x layer interconnect. In step 506, power may be provided to a second set of CMOS transistor devices through the second power rail and a third power rail. The third power rail extends across the standard cell. The third power rail is connected to the one of the first voltage or the second voltage. The third power rail includes at least one of a metal x layer interconnect or a metal x−1 layer interconnect. The second set of CMOS transistor devices is between the second power rail and the third power rail and powered by the second power rail and the third power rail. The x−1 layer interconnect is also coupled to the second set of CMOS transistor devices. In one configuration, the set of CMOS transistor devices includes a set of pMOS transistor devices and a set of nMOS transistor devices, and a width of the pMOS transistor devices is approximately equal to a width of the nMOS transistor devices. In one configuration, the pMOS transistor devices are on an n-type well, and one edge of the n-type well is approximately in a middle between the first power rail and the second power rail.

In one configuration, a standard cell CMOS device apparatus includes means for providing power to a set of CMOS transistor devices through a first power rail and a second power rail. The means for providing power to the set of CMOS transistor devices may be the first and second power rails. The first power rail extends across the standard cell. The first power rail is connected to one of a first voltage or a second voltage less than the first voltage. The second power rail extends across the standard cell. The second power rail is connected to an other one of the first voltage or the second voltage. The second power rail includes a metal x layer interconnect and a set of metal x−1 layer interconnects connected to the metal x layer interconnect. The set of CMOS transistor devices is between the first power rail and the second power rail. The apparatus further includes means for flowing a current through an x−1 layer interconnect extending under the second power rail and orthogonal to the second power rail. The means for flowing the current is the x−1 layer interconnect. The x−1 layer interconnect is coupled to the set of CMOS transistor devices. The apparatus may further include means for providing power to a second set of CMOS transistor devices through the second power rail and a third power rail. The means for providing power to the second set of CMOS transistor devices may be the second and third power rails. The third power rail extends across the standard cell. The third power rail is connected to the one of the first voltage or the second voltage. The third power rail includes at least one of a metal x layer interconnect or a metal x−1 layer interconnect. The second set of CMOS transistor devices is between the second power rail and the third power rail and powered by the second power rail and the third power rail. The x−1 layer interconnect is also coupled to the second set of CMOS transistor devices.

As discussed supra, when a power rail is within a standard cell, the power rail or a portion of the power rail may be separated to allow for local routing on one or more layers of the power rail. Specifically, if the power rail includes a metal x layer interconnect and a metal x−1 layer interconnect connected to the metal x layer interconnect, the metal x−1 layer interconnect may be separated/disconnected to allow for local inter-cell routing with metal x−1 layer interconnects. The metal x−1 layer interconnects for local inter-cell routing extend orthogonal to the metal x layer interconnect of the power rail. The use of the metal x−1 layer interconnects for local routing rather than metal x+m layer interconnects, where m is greater than or equal to one, frees up use of the metal x+m layer interconnects and allows for more metal x+m layer interconnects to be used for intra-cell routing. Further, when the power rail or a portion of the power rail in a standard cell is separated to allow for local routing on one or more layers of the power rail, a footprint of the standard cell may be closer to square shaped than otherwise, without increasing or substantially increasing use of x+m layer interconnects. Having a square shaped or close to square shaped footprint of a standard cell provides for better pin access for the standard cell. The height of a standard cell may also be reduced to provide an area savings. The exemplary CMOS device enables efficient multi-height cells with reduced dependence/use of x+m layer interconnects (m≥1) (e.g., M3) because the power rail on the metal x and metal x−1 layers allows for local inter-cell routing with x−1 layer interconnects under/between the power rail. However, the exemplary CMOS device uses more metal x layer interconnects than otherwise, as the power rails include metal x layer interconnects. When reducing the height of a standard cell, the widths of the p-type active regions and n-type active regions may be adjusted to be approximately equal. Reducing the PN ratio to one reduces the performance due to the drive reduction, but such performance degradation may be compensated by providing additional drive cells or boosting the voltage. Further, the n-type well may be centered to facilitate quick development of complementary logic (e.g., AND to OR, negated AND (NAND) to negated OR (NOR), AND-OR-invert (AOI) to OR-AND-invert (OAI), AND-OR (AO) to OR-AND (OA), etc.).

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A standard cell complementary metal oxide semiconductor (CMOS) device, comprising:
a first power rail extending across the standard cell, the first power rail being connected to one of a first voltage or a second voltage less than the first voltage;
a second power rail extending across the standard cell, the second power rail being connected to an other one of the first voltage or the second voltage, the second power rail including a metal x layer interconnect and a set of metal x−1 layer interconnects connected to the metal x layer interconnect;
a set of CMOS transistor devices between the first power rail and the second power rail and powered by the first power rail and the second power rail; and
an x−1 layer interconnect extending under the second power rail and orthogonal to the second power rail, the x−1 layer interconnect being coupled to the set of CMOS transistor devices.

2. The device of claim 1, wherein the x−1 layer interconnect extends between two x−1 layer interconnects of the set of metal x−1 layer interconnects that are part of the second power rail.

3. The device of claim 2, wherein x is equal to two and the second power rail includes a metal two (M2) layer interconnect and a set of metal one (M1) layer interconnects.

4. The device of claim 3, wherein the first power rail includes at least one of a metal one (M1) layer interconnect or a metal two (M2) layer interconnect.

5. The device of claim 1, wherein the first power rail and the second power rail extend parallel to each other.

6. The device of claim 1, wherein the set of metal x−1 layer interconnects extends under the metal x layer interconnect and parallel to the metal x layer interconnect.

7. The device of claim 1, further comprising:
a third power rail extending across the standard cell, the third power rail being connected to said one of the first voltage or the second voltage, the third power rail including at least one of a metal x layer interconnect or a metal x−1 layer interconnect; and
a second set of CMOS transistor devices between the second power rail and the third power rail and powered by the second power rail and the third power rail,
wherein the x−1 layer interconnect is also coupled to the second set of CMOS transistor devices.

8. The device of claim 1, wherein the set of CMOS transistor devices comprises a set of p-type metal oxide semiconductor (pMOS) transistor devices and a set of n-type metal oxide semiconductor (nMOS) transistor devices, and a width of the pMOS transistor devices is approximately equal to a width of the nMOS transistor devices.

9. The device of claim 8, further comprising an n-type well, the pMOS transistor devices being on the n-type well, wherein one edge of the n-type well is approximately in a middle between the first power rail and the second power rail.

10. A method of operating a standard cell complementary metal oxide semiconductor (CMOS) device, comprising:
providing power to a set of CMOS transistor devices through a first power rail and a second power rail, the first power rail extending across the standard cell, the first power rail being connected to one of a first voltage or a second voltage less than the first voltage, the second power rail extending across the standard cell, the second power rail being connected to an other one of the first voltage or the second voltage, the second power rail including a metal x layer interconnect and a set of metal x−1 layer interconnects connected to the metal x layer interconnect, the set of CMOS transistor devices being between the first power rail and the second power rail; and
flowing a current through an x−1 layer interconnect extending under the second power rail and orthogonal to the second power rail, the x−1 layer interconnect being coupled to the set of CMOS transistor devices.

11. The method of claim 10, wherein the x−1 layer interconnect extends between two x−1 layer interconnects of the set of metal x−1 layer interconnects that are part of the second power rail.

12. The method of claim 11, wherein x is equal to two and the second power rail includes a metal two (M2) layer interconnect and a set of metal one (M1) layer interconnects.

13. The method of claim 12, wherein the first power rail includes at least one of a metal one (M1) layer interconnect or a metal two (M2) layer interconnect.

14. The method of claim 10, wherein the first power rail and the second power rail extend parallel to each other.

15. The method of claim 10, wherein the set of metal x−1 layer interconnects extends under the metal x layer interconnect and parallel to the metal x layer interconnect.

16. The method of claim 10, further comprising providing power to a second set of CMOS transistor devices through the second power rail and a third power rail, the third power rail extending across the standard cell, the third power rail being connected to said one of the first voltage or the second voltage, the third power rail including at least one of a metal x layer interconnect or a metal x−1 layer interconnect, the second set of CMOS transistor devices being between the second power rail and the third power rail and powered by the second power rail and the third power rail, the x−1 layer interconnect also being coupled to the second set of CMOS transistor devices.

17. The method of claim 10, wherein the set of CMOS transistor devices comprises a set of p-type metal oxide semiconductor (pMOS) transistor devices and a set of n-type metal oxide semiconductor (nMOS) transistor devices, and a width of the pMOS transistor devices is approximately equal to a width of the nMOS transistor devices.

18. The method of claim 17, wherein the pMOS transistor devices are on an n-type well, and one edge of the n-type well is approximately in a middle between the first power rail and the second power rail.

19. A standard cell complementary metal oxide semiconductor (CMOS) device apparatus, comprising:
means for providing power to a set of CMOS transistor devices through a first power rail and a second power rail, the first power rail extending across the standard cell, the first power rail being connected to one of a first voltage or a second voltage less than the first voltage, the second power rail extending across the standard cell, the second power rail being connected to an other one of the first voltage or the second voltage, the second power rail including a metal x layer interconnect and a set of metal x−1 layer interconnects connected to the metal x layer interconnect, the set of CMOS transistor devices being between the first power rail and the second power rail; and means for flowing a current through an x−1 layer interconnect extending under the second power rail and orthogonal to the second power rail, the x−1 layer interconnect being coupled to the set of CMOS transistor devices.

20. The apparatus of claim 19, wherein the x−1 layer interconnect extends between two x−1 layer interconnects of the set of metal x−1 layer interconnects that are part of the second power rail.

21. The apparatus of claim 20, wherein x is equal to two and the second power rail includes a metal two (M2) layer interconnect and a set of metal one (M1) layer interconnects.

22. The apparatus of claim 21, wherein the first power rail includes at least one of a metal one (M1) layer interconnect or a metal two (M2) layer interconnect.

23. The apparatus of claim 19, wherein the first power rail and the second power rail extend parallel to each other.

24. The apparatus of claim 19, wherein the set of metal x−1 layer interconnects extends under the metal x layer interconnect and parallel to the metal x layer interconnect.

25. The apparatus of claim 19, further comprising means for providing power to a second set of CMOS transistor devices through the second power rail and a third power rail, the third power rail extending across the standard cell, the third power rail being connected to said one of the first voltage or the second voltage, the third power rail including at least one of a metal x layer interconnect or a metal x−1 layer interconnect, the second set of CMOS transistor devices being between the second power rail and the third power rail and powered by the second power rail and the third power rail, the x−1 layer interconnect also being coupled to the second set of CMOS transistor devices.

26. The apparatus of claim 19, wherein the set of CMOS transistor devices comprises a set of p-type metal oxide semiconductor (pMOS) transistor devices and a set of n-type metal oxide semiconductor (nMOS) transistor devices, and a width of the pMOS transistor devices is approximately equal to a width of the nMOS transistor devices.

27. The apparatus of claim 26, wherein the pMOS transistor devices are on an n-type well, and one edge of the n-type well is approximately in a middle between the first power rail and the second power rail.

\* \* \* \* \*